US006887752B2

(12) United States Patent
Shinohara et al.

(10) Patent No.: US 6,887,752 B2
(45) Date of Patent: May 3, 2005

(54) SEMICONDUCTOR MEMORY AND PROCESS FOR FABRICATING THE SAME

(75) Inventors: Sota Shinohara, Tokyo (JP); Koichi Takemura, Tokyo (JP); Yasuhiro Tsujita, Tokyo (JP); Hidemitsu Mori, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/690,316

(22) Filed: Oct. 21, 2003

(65) Prior Publication Data

US 2004/0079982 A1 Apr. 29, 2004

Related U.S. Application Data

(62) Division of application No. 10/100,336, filed on Mar. 18, 2002, now Pat. No. 6,730,955.

(30) Foreign Application Priority Data

Mar. 16, 2001 (JP) .......................................... 2001-75485

(51) Int. Cl.[7] .......................................... H01L 21/8242
(52) U.S. Cl. ....................... 438/250; 257/306; 438/239; 438/257
(58) Field of Search ............................... 438/239, 250, 438/257

(56) References Cited

U.S. PATENT DOCUMENTS

| 5,519,237 A | * | 5/1996 | Itoh et al. ................... 257/306 |
| 6,046,469 A | * | 4/2000 | Yamazaki et al. .......... 257/306 |
| 6,492,222 B1 | * | 12/2002 | Xing .......................... 438/240 |

FOREIGN PATENT DOCUMENTS

| JP | A 06-326249 | 11/1994 |
| JP | A 07-245237 | 9/1995 |
| JP | A 08-236719 | 9/1996 |
| JP | A 11-317500 | 11/1999 |

OTHER PUBLICATIONS

"Metallization" McGraw–Hill, *ULSI Technology, International Editions*, Chapter 8, 1996, coverpage and p. 451.

* cited by examiner

*Primary Examiner*—Michael Tran
*Assistant Examiner*—Thao P. Le
(74) *Attorney, Agent, or Firm*—Hayes Soloway P.C.

(57) ABSTRACT

In a semiconductor memory, a barrier layer formed of a first metal film, a metal nitride film and a second metal film laminated in the named order is formed under a lower electrode of a ferroelectric capacitor in a memory cell, in order to minimize a pealing and lifting of the lower electrode from an underlying plug in the process of forming a ferroelectric material film as a capacitor dielectric film and in its succeeding annealing process. The metal nitride film is formed of a nitride of a metal constituting the first or second metal film.

11 Claims, 10 Drawing Sheets

1 SEMICONDUCTOR SUBSTRATE

1 SEMICONDUCTOR SUBSTRATE

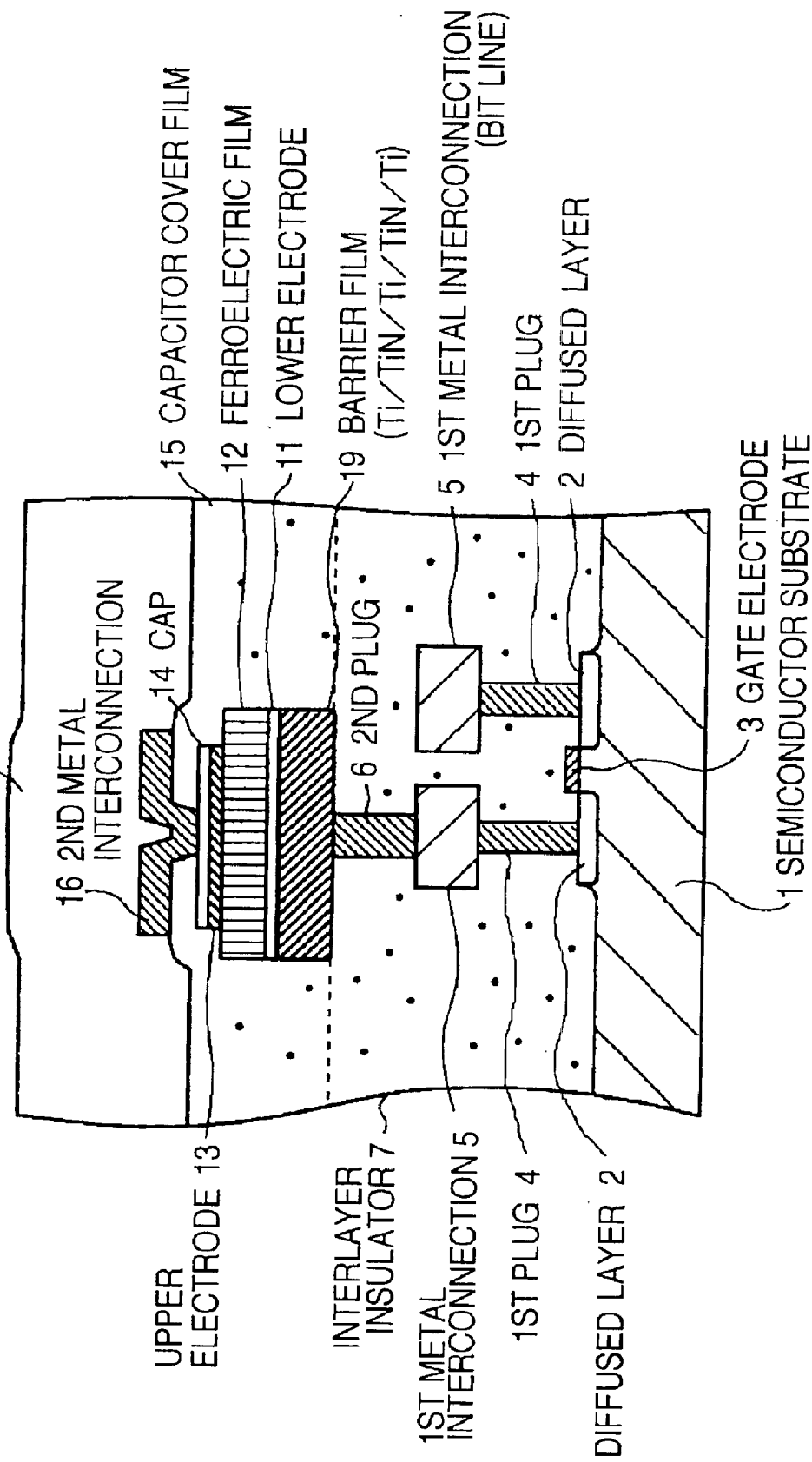

SEMICONDUCTOR MEMORY AND PROCESS FOR FABRICATING THE SAME

CROSS-REFERENCE TO RELATED APPLICATION

This Application is a divisional of U.S. application Ser. No. 10/100,336, filed Mar. 18, 2002, now U.S. Pat. No. 6,730,955, granted May 4, 2004.

BACKGROUND OF THE INVENTION

The present invention relates to a semiconductor memory and a process for fabricating the same, and more specifically, to a semiconductor memory in which a memory cell is formed on a semiconductor substrate to be constituted of a memory cell selecting transistor and a capacitor having a capacitor dielectric film formed of a ferroelectric material or a highly dielectric material in order to store information, and a process for fabricating the same.

Recently, a technology of a semiconductor memory having a capacitor dielectric film formed of a ferroelectric material or a highly dielectric material is actively developed. This semiconductor memory is so configured to store the information by utilizing polarization of the ferroelectric or highly dielectric material capacitor or whether or not an electric charge is stored in the highly dielectric material capacitor.

Referring to FIG. 7, there is shown a diagrammatic sectional view of a prior art memory cell. As shown in FIG. 7, source/drain diffused layers 102 are formed on a surface region of a semiconductor substrate (silicon substrate) 101, and a gate electrode 103 is formed on a gate insulating film (not shown) formed on the semiconductor substrate 101. Thus, a field effect transistor constituting a memory cell selecting transistor is formed. A bit line is constituted of a first metal interconnection 105, which is electrically connected through a first plug (contact plug) 104 to one of the diffused layers 102 of the field effect transistor.

Above the field effect transistor, an interlayer insulator film, the first metal interconnection 105 and the first plug 104, are formed, and thereon, a capacitor is formed, which is constituted of a barrier layer 107, a lower electrode 111 and a ferroelectric material film (or highly dielectric material film) 112 and an upper electrode 113. The lower electrode 111 is electrically connected to the other of the diffused layers 102, through the barrier layer 107, the second plug (via plug) 106, the first metal interconnection 105 and the first plug 104. With this arrangement, a word line functions as the gate electrode 103 of the field electric transistor.

Incidentally, in FIG. 7, the interlayer insulator film 118 is formed of a first interlayer insulator film which is firmed on the semiconductor substrate and on which the first metal interconnection 105 is formed, and a second interlayer insulator film which is formed on the first interlayer insulator film and on which the barrier layer 107 is formed. However, the first and second interlayer insulator films are shown as a single interlayer insulator film 118.

The ferroelectric material film (high dielectric material film) 112 is formed of for example PZT ($PbZr_xTi_{1-x}O_3$) or SBT ($SrBi_2Ta_2O_9$), and formed by CVD (chemical vapor deposition) or another, as disclosed in for example JP-A-11-317500.

A capacitor cover insulating film 115 is formed on the capacitor, and a second metal interconnection 116 is formed as a plate line on the cover film 115.

In many cases, it is required to form the ferroelectric (high dielectric) material film in an oxidizing atmosphere or to anneal the ferroelectric (high dielectric) material film in an oxygen atmosphere after the ferroelectric (high dielectric) material film is formed, in order to stabilize the ferroelectric (high dielectric) material film. Because of this, the lower electrode 111 and the upper electrode 113 are formed of a platinum metal such as Pt, Ir and Ru, or alternatively a conductive oxide of platinum metal such as $IrO_2$, $RuO_2$, and $SrRuO_2$. As shown in for example JP-A-08-236719, the barrier film 107 is provided to prevent the material of the plug from diffusing upward, and is formed of TiN in ordinary cases.

The first and second interconnections 105 and 116 are required to have an easy fine patterning, an excellent tight adhesion to $SiO_2$ which forms the interlayer insulator film 118 and the capacitor cover film 115, and a low electric resistivity, and are formed of a multilayer film using $WSi_2$, Ti, TiN or Al, for example.

On the second metal interconnection 116, a passivation film 117 is formed by forming a film of silicon nitride ($SiN_x$) or silicon oxynitride film ($SiO_xN_y$) in a plasma CVD process. Incidentally, as described in JP-A-07-245237, it is known that a data rewriting anti-fatigue property in a semiconductor memory is greatly dependent upon the material which constitutes the lower electrode 111 in contact with the ferroelectric (or high dielectric) material film. If the lower electrode 111 is formed of Ir, Ru or a conductive oxide such as $IrO_2$, $RuO_2$, and $SrRuO_2$, the data rewriting anti-fatigue property can be remarkably improved. Because of this, these materials are used to form the lower electrode 111.

In the case that the lower electrode 111 is formed of Ir, Ru or a conductive oxide such as $IrO_2$, $RuO_2$, and $SrRuO_2$, it is known as shown in JP-A-06-326249 that in consideration of the tight adhesion with the lower electrode and the semiconductor substrate, the barrier layer is formed of TiN/Ti (lower layer of Ti and upper layer of TiN), and a ferroelectric (high dielectric) material film is deposited on a multilayer film which is formed by forming the barrier layer and the lower electrode in the named order.

However, the inventors have discovered a problem that when the multilayer film is formed by forming the barrier layer (formed of TiN/Ti) and the lower electrode in the named order on the semiconductor substrate having a plug formed therein (in which the plug is exposed at a surface of the interlayer insulator film), and then, the ferroelectric (high dielectric) material film is deposited on the multilayer film, the lower electrode is pealed off and is lifted up from the barrier layer (TiN/Ti), only in a region positioned above the plug.

Referring to FIG. 8A, there is shown a scanning electron microscope photograph of a section of one example, in which on a semiconductor substrate having a W plug formed therein, Ru/TiN/Ti is formed as a lower electrode/barrier layer structure, and then, PZT is deposited thereon in a CVD process at a temperature of 430 degrees Celsius. FIG. 8B is a diagrammatic view showing the feature of the photograph of FIG. 8A.

It would be seen from FIGS. 8A and 8B that PZT/Ru is pealed off and lifted up from TiN only in the region of the W plug. This lifting is considered as follows: Since PZT causes a large stress, a stress lifting up the PZT film is generated and concentrated in a region above the W plug, because of a thermodynamic relation among the semiconductor substrate, the W plug, the barrier layer, the lower electrode and the PZT film.

If the lower electrode above the W plug was pealed off and lifted up from the barrier layer, the capacitor of the memory cell above the W plug becomes defective, with the result that the yield of the semiconductor memory drops. In addition, reliability of the device characteristics drops dependently upon the degree of lifting-up from the barrier layer (the degree of connection insufficiency).

BRIEF SUMMARY OF THE INVENTION

Accordingly, it is an object of the present invention to provide a semiconductor memory which has overcome the above mentioned problem of the prior art, and a process for fabricating the same.

Another object of the present invention is to provide a semiconductor memory which has prevented the lifting of the lower electrode from the barrier layer in a region above the plug, thereby to improve the yield of production, and a process for fabricating the same.

The above and other objects of the present invention are achieved in accordance with the present invention in which a capacitor is formed of a lower electrode, a dielectric film and an upper electrode, and a barrier layer lying under the lower electrode is constituted to include at least a first metal film, a metal nitride film and a second metal film. The metal nitride film can be preferably formed of a nitride of a metal element of the first or second metal film.

Now, the principle of the present invention will be described. In order to overcome the above mentioned problems, the inventors made various experiments and studies, and found out that if a barrier layer under a lower electrode of a ferroelectric material capacitor (or a highly dielectric material capacitor) is formed to include a triplelayer structure in which a film of a nitride of a metal such as Ti and Ta is inserted between two metal layers, it is possible to effectively prevent the dielectric film (for example, PZT film) and the lower electrode (Ir or Ru) from being lifted up from the barrier film in a region above the plug.

A second metal layer constituting an uppermost layer of the triplelayer structure serves to elevate a tight adhesion to the lower electrode. The metal nitride film under the second metal layer is required not only for preventing diffusion of the material of the plug and oxygen, but also to prevent the lower electrode from being lifted up in a region above the W plug. This is confirmed on the basis of the result of experiments in which if PZT is deposited on Ru/Ti, the lifting occurs in a region above the plug. This phenomenon is considered that the upward diffusion of the plug material influences the lifting of the lower electrode.

Here, if the barrier layer is constituted of only the first metal and the metal nitride film laminated in the named order, it is not sufficient to prevent the lifting of the lower electrode in the region above the plug. This is confirmed on the basis of the result of experiments in which if PZT is deposited on Ru/Ti/TiN, the lifting occurs in a region above the plug.

Therefore, in order to prevent the pealing of the lower electrode, it is necessary to form the first metal layer under the metal nitride film, so as to form the triplelayer structure in which the first metal layer, the metal nitride film and the second metal layer are formed in the named order counted from a lower position. The metal nitride film is formed of a nitride of a metal element of the first or second metal film.

The reason for the first metal layer required to prevent the pealing of the lower electrode is considered that since crystallinity of the metal nitride film is influenced by crystallinity of the underlying film, the first metal layer can serve to relax a concentration of the stress above the plug.

Preferably, the triplelayer structure constituting the barrier layer is formed of a triplelayer film formed of a TiN layer sandwiched between Ti layers (Ti/TiN/Ti) or a triplelayer film formed of a TaN layer sandwiched between Ta layers (Ta/TaN/Ta). Ti and Ta have an excellent adhesion to Ir and Ru.

Here, Ti, TiN, Ta and TaN are materials frequently used in conventional LSI fabricating process, and therefore, a film of those materials can be formed by utilizing existing film formation machines. Therefore, it is possible to prevent elevation of the production cost of the semiconductor memory.

Further preferably, the upper electrode and the lower electrode of the ferroelectric material (or highly dielectric material) capacitor are formed of mainly Ru or $RuO_x$, since within a platinum metal group, Ru is only one material which can be finely patterned by a chemical etching.

The frequency of occurrence of the lower electrode lifting is strongly dependent upon a film deposition temperature of the ferroelectric material (or highly dielectric material). According to experiments the inventors conducted, if the film deposition temperature of PZT exceeds 475 degrees Celsius, even if the barrier film is formed of the triplelayer film, the lower electrode lifting appears sometimes. Accordingly, the film deposition temperature of the ferroelectric material is preferably not greater than 500 degrees Celsius, and more preferably not greater than 475 degrees Celsius.

Thus, in the semiconductor memory in accordance with the present invention which includes an interlayer insulator film formed on a semiconductor substrate where a transistor or another active circuit element are formed, a plug reaching a surface of the interlayer insulator film, and a capacitor formed by forming a barrier layer, a lower electrode, a ferroelectric material film or a highly dielectric material film, and an upper electrode on the plug in the named order counted from a lower position, the lower electrode is formed of Ru, Ir or a conductive oxide, and the barrier layer is formed to a multilayer structure having at least three layers. In the multilayer structure, a layer in contact with the plug or the interlayer insulator film is formed of a first metal layer, and a layer in contact with the lower electrode is formed of a second metal layer, at least one layer of metal nitride film being formed between the first and second metal layers. The metal nitride film is formed of a nitride of a metal element of the first or second metal layer.

The above and other objects, features and advantages of the present invention will be apparent from the following description of preferred embodiments of the invention with reference to the accompanying drawings.

BRIEF DESCRIPTION OF THE DRAWINGS

FIGS. 5 and 6 are diagrammatic sectional views showing second and third practical embodiments of the semiconductor memory in accordance with the present invention, respectively;

DETAILED DESCRIPTION OF THE INVENTION

{Conceptional Embodiment}

Figure 1:
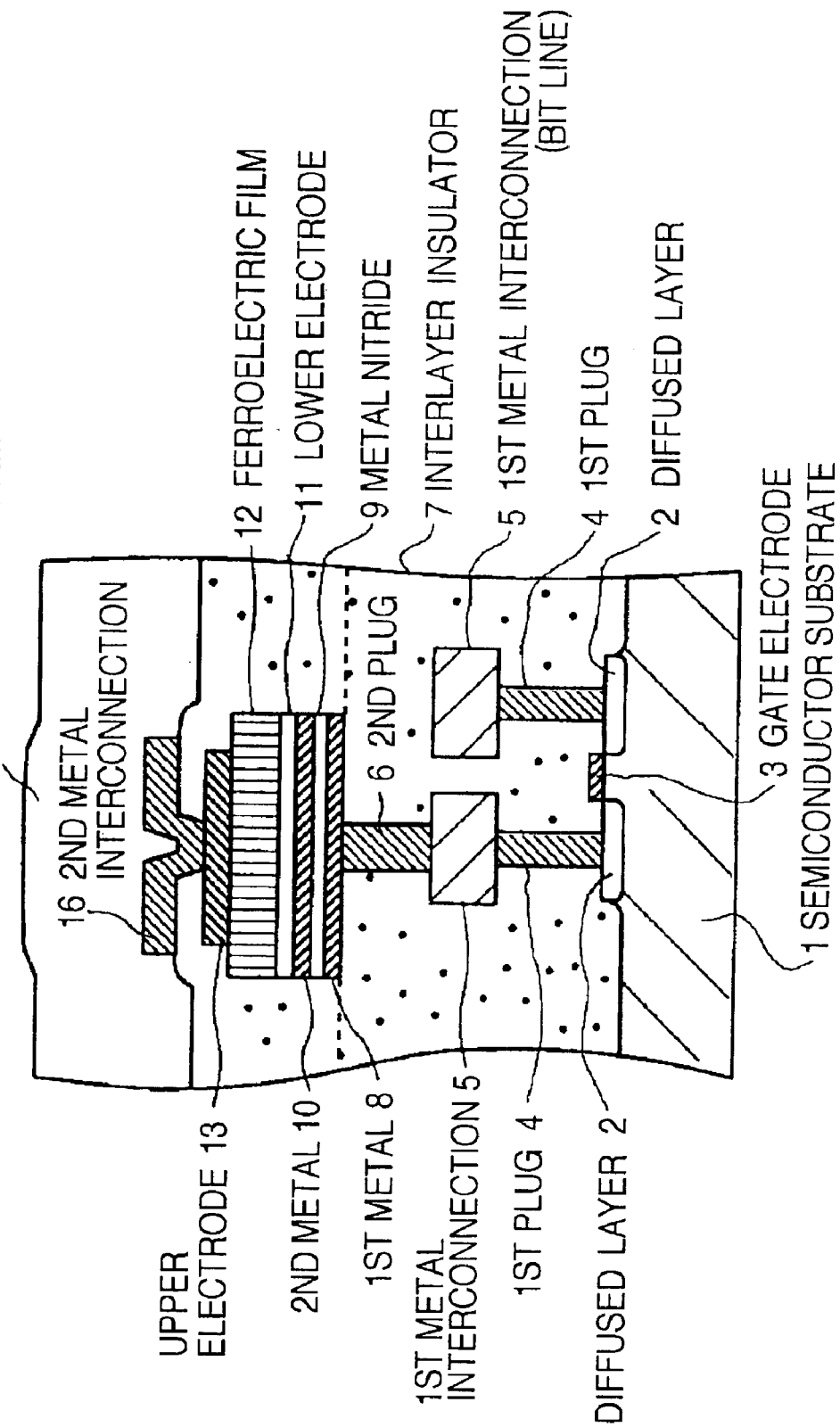
FIG. 1 is a diagrammatic sectional view showing a conceptional embodiment of the semiconductor memory in accordance with the present invention.

Referring to FIG. 1, there is shown a diagrammatic sectional view showing a capacitor and a memory cell selecting transistor connected to the capacitor, in one memory cell, in a conceptional embodiment of the semiconductor memory in accordance with the present invention.

The shown semiconductor memory includes a semiconductor substrate 1, a memory cell selecting transistor formed on the semiconductor substrate 1, a first metal interconnection 5, a ferroelectric material capacitor (or high dielectric material capacitor), and a second metal interconnection 16 formed above the ferroelectric material capacitor (or high dielectric material capacitor). In FIG. 1, the metal interconnection is shown as a two-layer interconnection structure constituted of the first metal interconnection 5 and the second metal interconnection 16. However, the metal interconnection is not limited only to the two-layer interconnection structure, but may be any multilayer interconnection structure other than the two-layer interconnection structure.

The ferroelectric material capacitor (or high dielectric material capacitor) includes a lower electrode 11, a ferroelectric material (or high dielectric material) film 12 and an upper electrode 13. The upper electrode 13 is mainly formed of a platinum metal element.

The ferroelectric material film 12 is formed for example PZT, PLZT or SBT. In the following, the ferroelectric material capacitor having a capacitor dielectric film formed of a ferroelectric material will be explained, but it is to be understood that the present invention can be equally applied to a high dielectric material capacitor having a capacitor dielectric film formed of a high dielectric material such as tantalum oxide ($Ta_2O_5$) and BST ((Ba, Sr)$TiO_3$).

The lower electrode 11 is mainly formed of a platinum metal such as Ir and Ru, or alternatively a conductive oxide of platinum metal such as $IrO_2$, $RuO_2$, and $SrRuO_2$.

A second metal film 10 is formed under and in contact with the lower electrode 11, and a first metal film 8 is formed on and in contact with a second plug 6.

A metal nitride film 9 is inserted between the first metal film 8 and the second metal film 10. Incidentally, a metal other than metal nitride film 9 may be inserted between the first metal film 8 and the second metal film 10. The second metal interconnection 16 is in contact with the upper electrode 13 within a contact hole.

Referring to FIGS. 2A to 2D, there are diagrammatic sectional views for illustrating the process for fabricating the semiconductor memory shown in FIG. 1. Now, the process for fabricating the semiconductor memory shown in FIG. 1 will be explained with reference to FIGS. 2A to 2D.

Figure 2A:
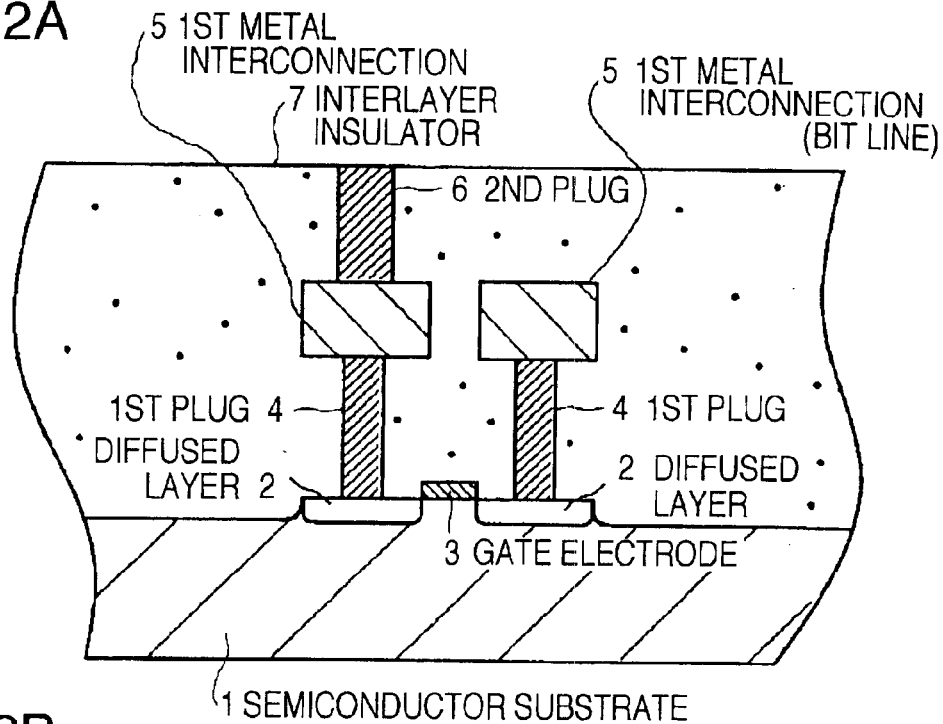
FIGS. 2A to 2D are diagrammatic sectional views for illustrating the process for fabricating the semiconductor memory shown in FIG. 1.

In accordance with a conventional MOS transistor fabricating process, a transistor, a first plug 4, a first metal interconnection, and a second plug 6 are formed on a semiconductor substrate 1, as shown in FIG. 2A. The first metal interconnection 5 is mainly formed of aluminum (Al), and the first plug 4 and the second plug 6 are formed of tungsten (W) or polysilicon. After the second plug 6 is formed on the first metal interconnection 5, a surface of an interlayer insulator film 7 is planarized by a chemical mechanical polishing (CMP), also as shown in FIG. 2A.

Figure 2B:
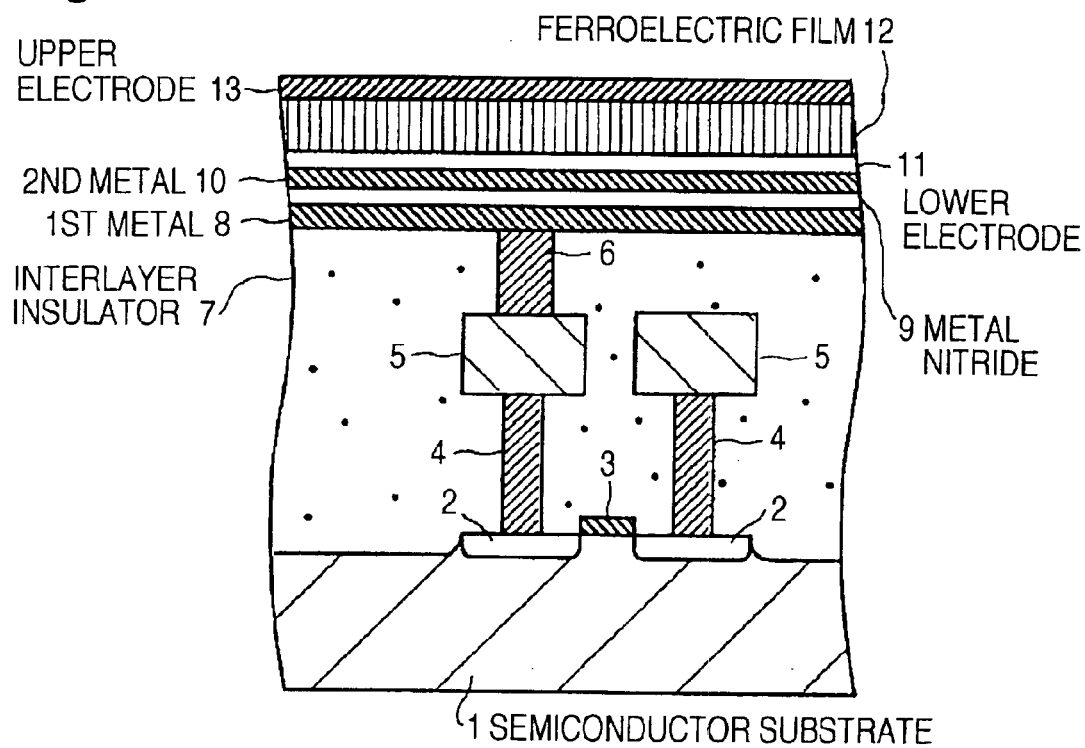

After the planarization, a first metal film 8, a metal nitride film 9 and a second metal film 10 are formed in the named order on the interlayer insulator film 7, as shown in FIG. 2B. The first metal film 8 and the second metal film 10 is formed of for example Ti or Ta. However, the second metal film 10 can be formed of Pt.

The metal nitride film 9 is formed of a nitride of a metal element of the first metal film 8 or the second metal film 10.

Thereafter, a lower electrode 11 is formed, and a ferroelectric material film 12 and an upper electrode 13 are formed in the named order on the lower electrode 11, as shown in FIG. 2B.

The lower electrode 11 is formed of Ir or Ru, or alternatively a conductive oxide such as $IrO_2$, $RuO_2$, or $SrRuO_2$.

The ferroelectric material film 12 is preferably formed of PZT (PbZr$_x$Ti$_{1-x}$O$_3$), since it exhibits at ordinary temperatures a remanence polarization required for an operation as a non-volatile memory. The PZT film constituting the ferroelectric material film 12 can be formed by a sputtering, a solgel method or a CVD process. However, the ferroelectric material film 12 can be formed of PLZT ((Pb, La)(Zr, Ti)$O_3$), or SBT (SrBi$_2$Ta$_2$O$_9$). The formation of the ferroelectric material film 12 is carried out at a temperature of not greater than 500 degrees Celsius, more preferably, at a temperature of not greater than 475 degrees Celsius.

The upper electrode 13 is formed of Ir or Ru, or alternatively a conductive oxide such as $IrO_2$, $RuO_2$, or $SrRuO_2$. In the case that the upper electrode 13 is formed of mainly Ru or $RuO_2$, it is preferred to form a cap layer of TiN or another on the upper electrode 13. Ru or $RuO_2$ is extinguished by an oxygen plasma processing in order to remove a photoresist which was used for patterning the capacitor or for forming a contact to the upper electrode. Therefore, if the cap layer of TiN or another is formed on the upper electrode 13, it is possible to prevent Ru or $RuO_2$ from being extinguished in the oxygen plasma processing.

Figure 2C:
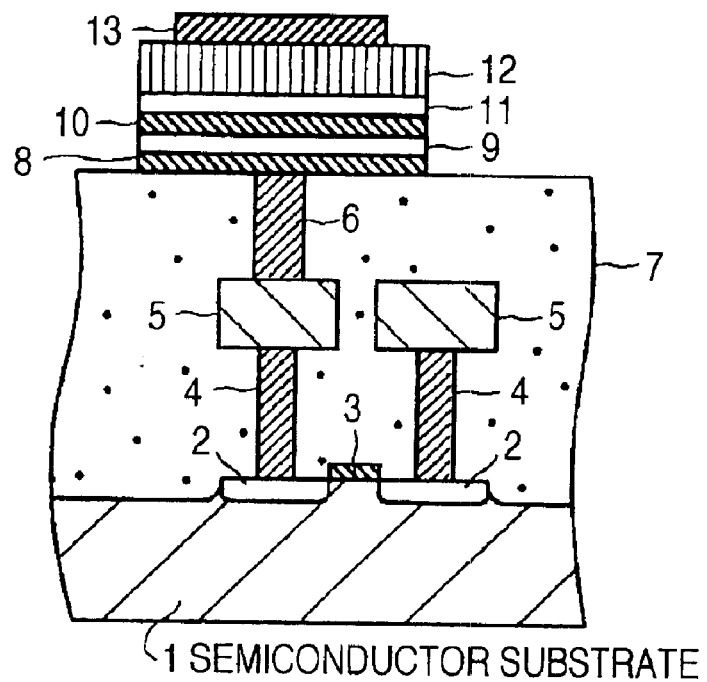

After the upper electrode 13 is formed, a stacked structure formed of the upper electrode 13, the ferroelectric material film 12, the lower electrode 11, the second metal 10, the metal nitride film 9 and the first metal 8 is patterned by an etching using a patterned photoresist as a mask, as shown in FIG. 2C.

Figure 2D:
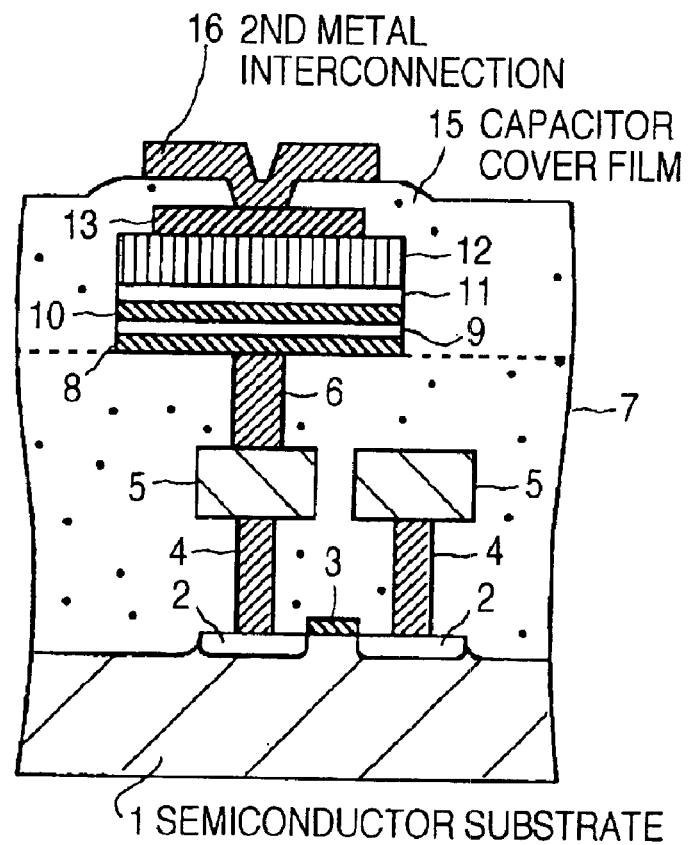

Thereafter, a capacitor cover film 15 is formed by depositing an insulator film such as silicon oxide film, and then, a contact hole reaching to the upper electrode 13 is formed as shown in FIG. 2D.

Furthermore, a second metal interconnection 16 is formed of mainly $WSi_2$, TiN or Al, also shown in FIG. 2D.

In addition, a passivation film 17 is formed to cover the second metal interconnection 16 which constitutes a plate line, as shown in FIG. 1. This passivation film 17 is formed by depositing a silicon nitride (SiN$_x$) or a silicon oxynitride (SiO$_x$N$_y$) by a plasma CVD process.

With this arrangement, the lower electrode is prevented from being lifted up in a region of the plug in the process of forming the ferroelectric material (high dielectric material) film and/or in the succeeding annealing process.

{Practical Embodiments}

Figure 3:
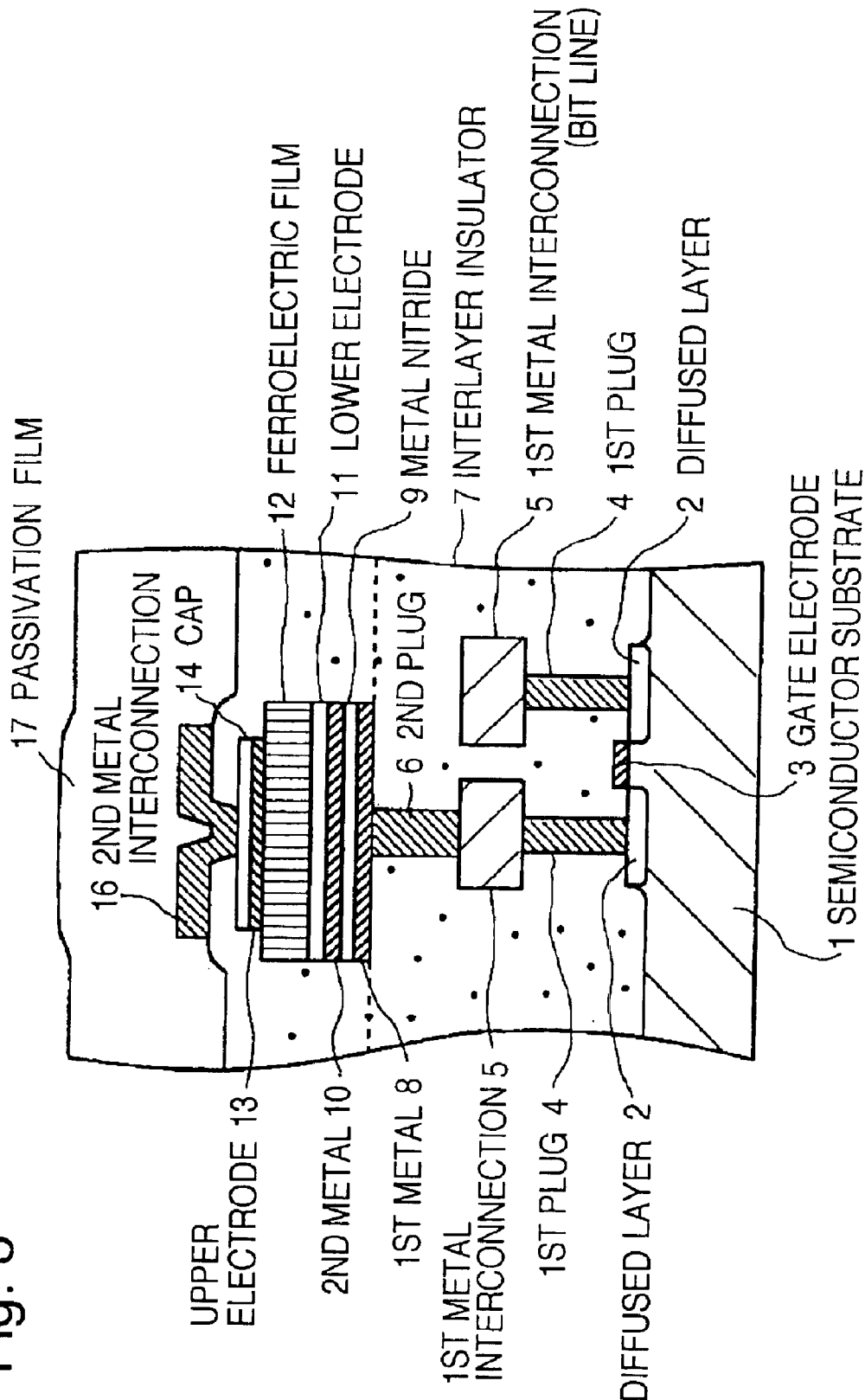
FIG. 3 is a diagrammatic sectional view showing a first practical embodiment of the semiconductor memory in accordance with the present invention.

Referring to FIG. 3, there is shown a diagrammatic sectional view showing a first practical embodiment of the semiconductor memory in accordance with the present invention.

The shown semiconductor memory includes a semiconductor substrate 1 such a silicon substrate, a memory cell selecting transistor formed on the silicon substrate 1, a first metal interconnection 5, a ferroelectric material capacitor, and a second metal interconnection 16 formed above the ferroelectric material capacitor.

The ferroelectric material capacitor includes a lower electrode 11, a ferroelectric material film 12 and an upper electrode 13. Under the lower electrode 11, a Ti film is formed as the second metal film 10, and under the second metal film 10, a TiN film is formed as the metal nitride film 9. Under the metal nitride film 9, a Ti film is formed as the first metal film 8.

Now, the process for fabricating the semiconductor memory shown in FIG. 3 will be explained with reference to FIGS. 4A to 4D, which are diagrammatic sectional views for illustrating the process for fabricating the semiconductor memory shown in FIG. 3.

Figure 4A:
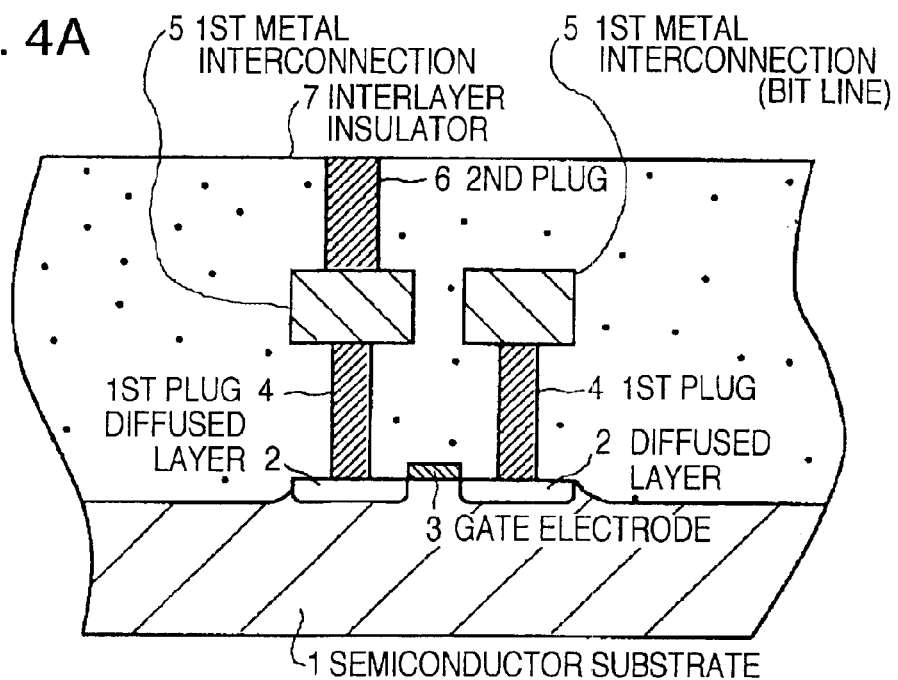
FIGS. 4A to 4D are diagrammatic sectional views for illustrating the process for fabricating the semiconductor memory shown in FIG. 3.

In accordance with a conventional silicon semiconductor integrated circuit fabricating process (for fabricating a LSI including at least one metal interconnection layer), a field effect transistor, a first plug 4 and a first metal interconnection 5 are formed on a semiconductor substrate 1, as shown in FIG. 4A.

On the first metal interconnection 4, a second plug 6 is formed and then planarized at a surface of an interlayer insulator film 7 by a CMP process, also as shown FIG. 4A. Therefore, the second plug 6 reaches the surface of the interlayer insulator film 7.

The first metal interconnection 4 is formed by depositing Ti, TiN, Al and TiN in the named order counted from a lower position. In this embodiment, each of the first plug 4 and the second plug 6 is formed of W (tungsten).

Succeedingly, on the planarized interlayer insulator film 7, Ti constituting the first metal film 8, TiN constituting the metal nitride film 9 and Ti constituting the second metal film 10 are deposited in the named order by sputtering. Furthermore, Ru is deposited as the lower electrode 11 on the second metal film 10 by sputtering, as shown in FIG. 4B.

Figure 4B:
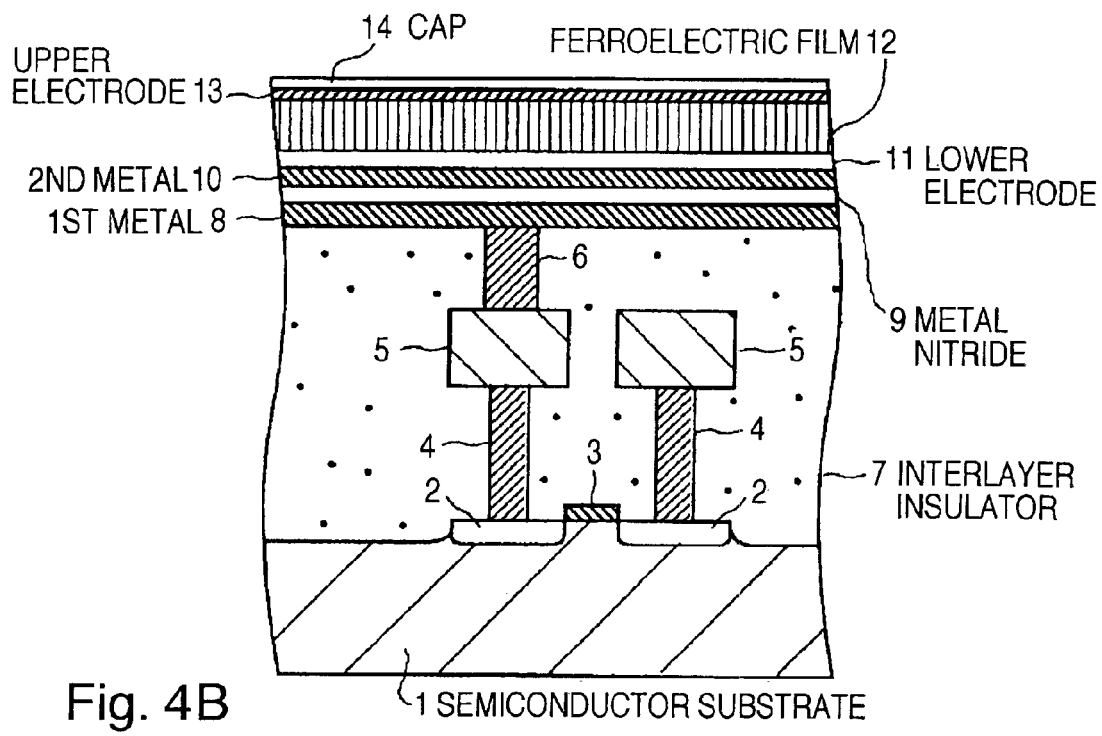

Furthermore, a ferroelectric material film 12 is formed on the lower electrode 11, also as shown in FIG. 4B. The ferroelectric material film 12 is formed by depositing a PZT($PbZr_{0.45}Ti_{0.55}O_3$) to have a film thickness of about 200 nm at a substrate temperature of 430 degrees Celsius by a CVD process, as disclosed in for example JP-A-11-317500.

After the PZT film is formed, an annealing is carried out in an oxygen atmosphere at a temperature of 400 degrees Celsius for 10 minutes, in order to improve a polarization characteristics of the ferroelectric material. The deposition of the PZT film and the succeeding annealing are carried out in an oxidizing atmosphere.

Conventionally, it is in many cases that the deposition of the ferroelectric film and the succeeding annealing are carried out at a temperature of about 600 degrees Celsius, as described in for example JPA-08-236719. In these cases, the second plug 6 or the Ti and TiN formed on the second plug 6 are oxidized, with the result that an insufficient or poor connection occurs between the lower electrode 11 and the second plug 6.

In this embodiment, however, the PZT film is formed in the CVD process. In the CVD process, the substrate temperature is as low as 430 degrees Celsius or less, and therefore, the second plug 6 or the Ti and TiN formed on the second plug 6 are in no way oxidized in the deposition process of the ferroelectric film 12 and the succeeding annealing process. Accordingly, neither insufficient nor poor connection occurs between the lower electrode 11 and the second plug 6.

Thereafter, on the ferroelectric material film 12, a Ru film constituting the upper electrode 13 and a TiN film constituting the cap layer 14 are formed in the named order by a sputtering, also as shown in FIG. 4B. The cap layer 14 formed on the upper electrode 13 is provided in order to prevent Ru from being extinguished by an oxygen plasma processing performed to remove a photoresist mast which is used for patterning the capacitor or for forming a contact hole to the upper electrode 13, since Ru is easily removed in the oxygen plasma processing.

Figure 4C:
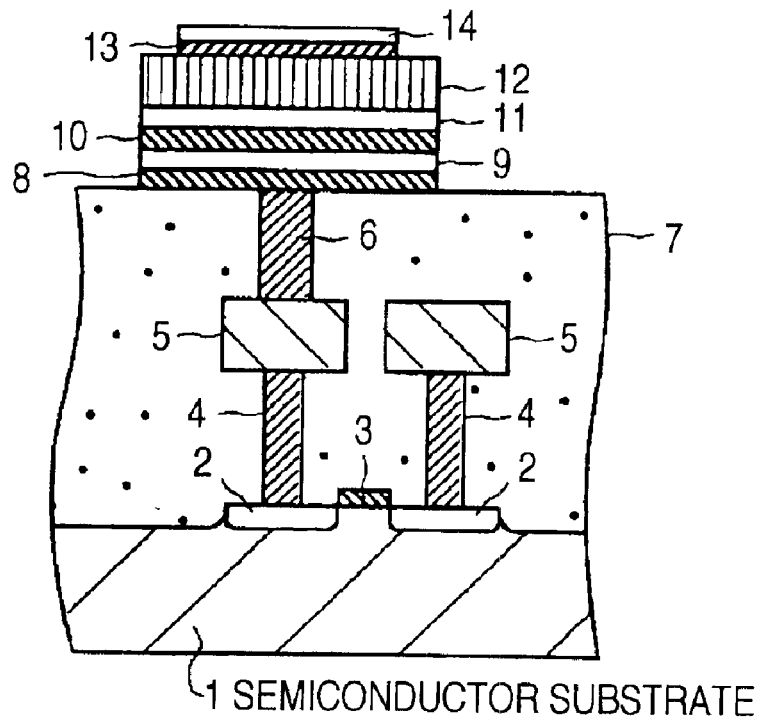

Succeedingly, the cap layer 14 and the upper electrode 13 is patterned by a RIE (Reactive Ion Etching) process. Then, the ferroelectric material film 12, the lower electrode 11, the second metal film 10, the metal nitride film 9 and the first metal film 8 are patterned in a single RIE process, as shown in FIG. 4C.

Figure 4D:
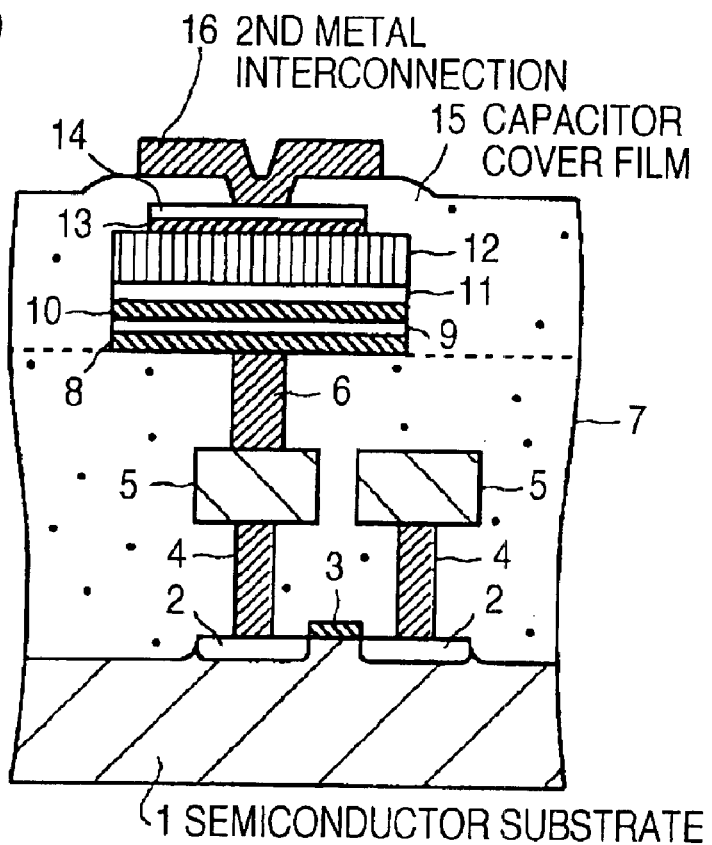

Thereafter, a capacitor cover film 15 is formed by depositing a $SiO_2$ film at a substrate temperature of 375 degrees Celsius by a plasma CVD process using ozone ($O_3$) and TEOS (tetraethylorthosilicate) as a source gas. In addition, a contact hole reaching the cap layer 14 is formed in the capacitor cover film 15 by a RIE process, as shown in FIG. 4D. In order to remove a damage applied to the ferroelectric material film 12 when the contact hole is formed, an annealing is carried out in a nitrogen atmosphere at a temperature of 400 degrees Celsius for 10 minutes after formation of the contact hole.

As a second metal interconnection 16, TiN, Al and TiN are deposited in the named order by a sputtering, and then, patterned by a RIE process as to form a plate line, as shown in FIG. 4D.

After the patterning is carried out to form the plate line, an annealing is performed in an oxygen atmosphere at a temperature of 400 degrees Celsius for 10 minutes in order to stabilize the polarization characteristics of the ferroelectric material.

Thereafter, a passivation film 17 is formed by depositing a silicon oxynitride ($SiO_xN_y$) having a film thickness of 1 micrometer at a substrate temperature of 400 degrees Celsius by a plasma CVD process using $SiH_4$, $NH_3$ and $N_2O$ as source gases.

Now, a second practical embodiment of the semiconductor memory in accordance with the present invention will be described with reference to FIG. 5, which is a diagrammatic sectional view showing the second practical embodiment.

This second practical embodiment is different from the first practical embodiment shown in FIG. 3 only in that the barrier layer is formed of a five-layer multilayer structure of Ti/TiN/Ti/TiN/Ti. Therefore, a further explanation will be omitted.

As seen from this embodiment, it is sufficient if the barrier layer includes a metal nitride film (TiN in this embodiment) between the second metal layer (Ti in this embodiment) in contact with the lower electrode 11 and the first metal layer (Ti in this embodiment) in contact with the plug 6. In other words, another or other metal films can be inserted between the second metal layer and the first metal layer. In this second practical embodiment, a multilayer film of TiN/Ti/TiN is inserted between the second metal layer (Ti) and the first metal layer (Ti) in contact with the plug 6.

Figure 6:
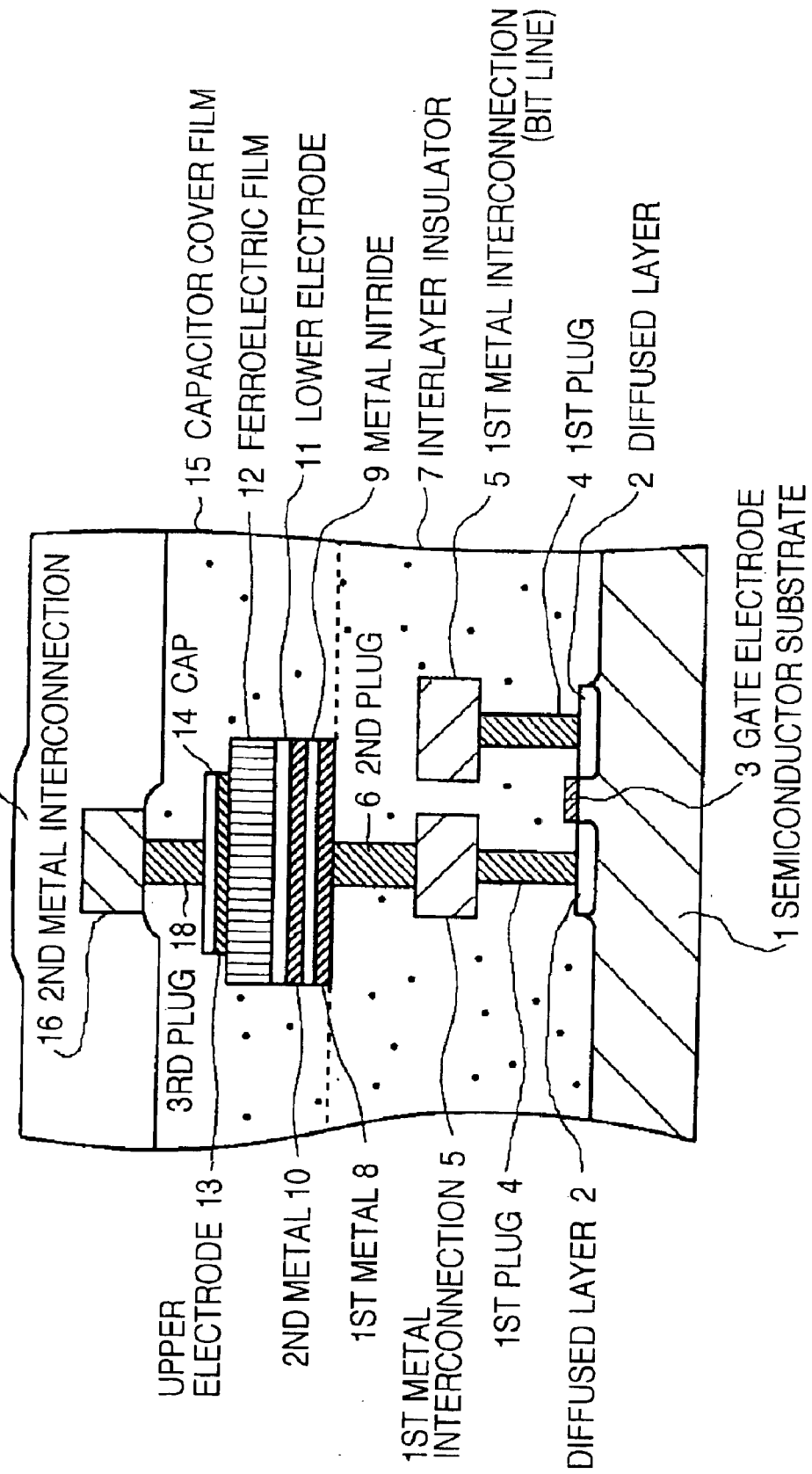
Figure 7:
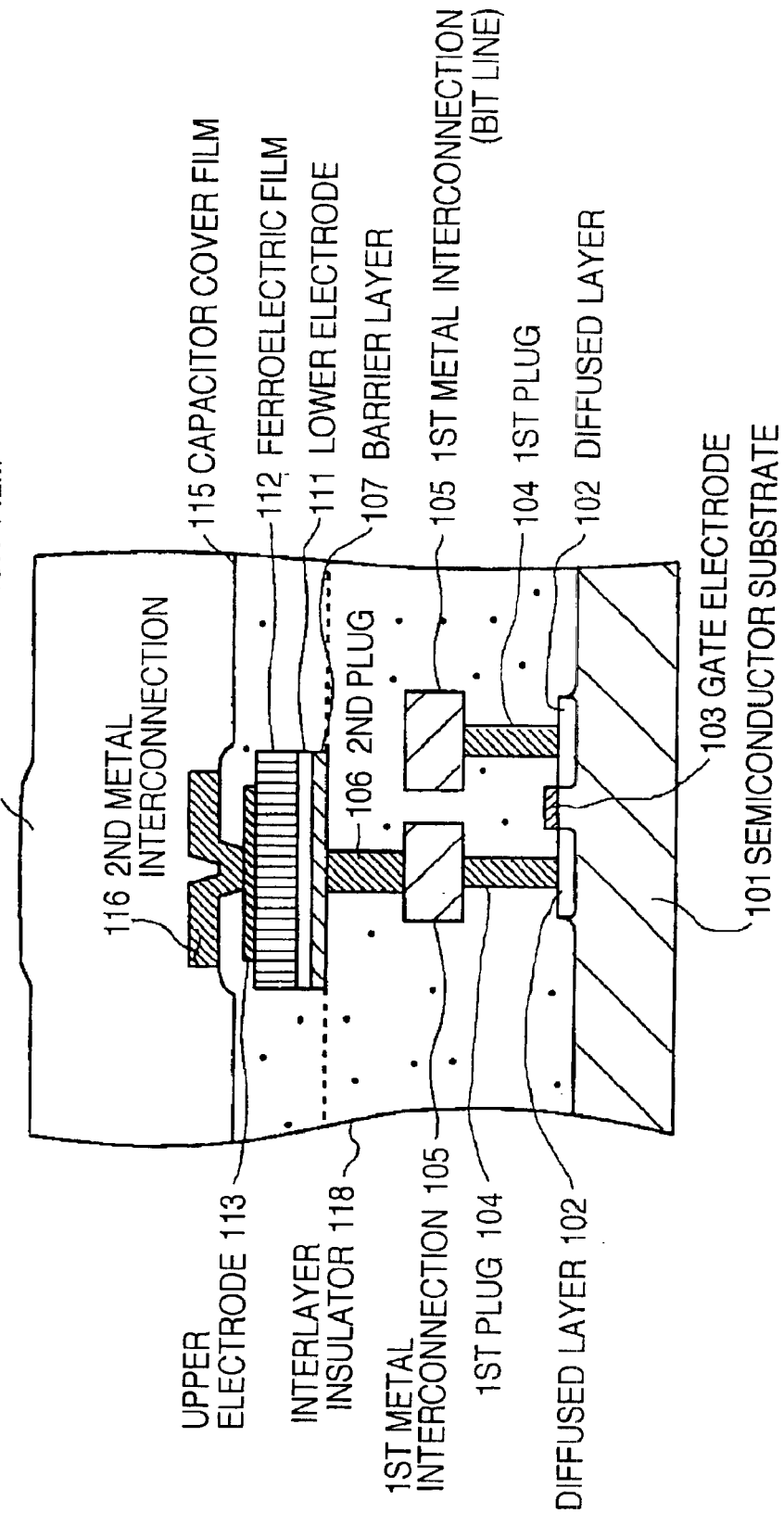
FIG. 7 is a diagrammatic sectional view showing a prior art semiconductor memory.
Figure 8A:
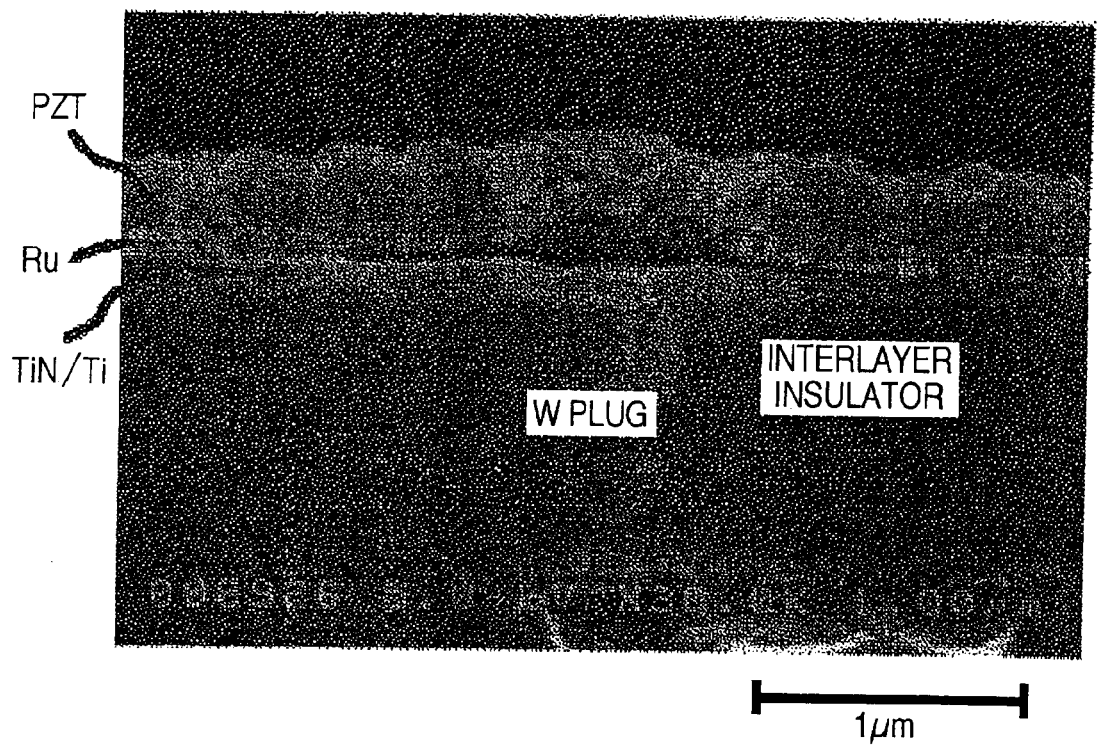
FIG. 8A is a scanning electron microscope photograph of a section of a lower electrode formed on a W plug formed on a semiconductor substrate in the prior art semiconductor memory.
Figure 8B:
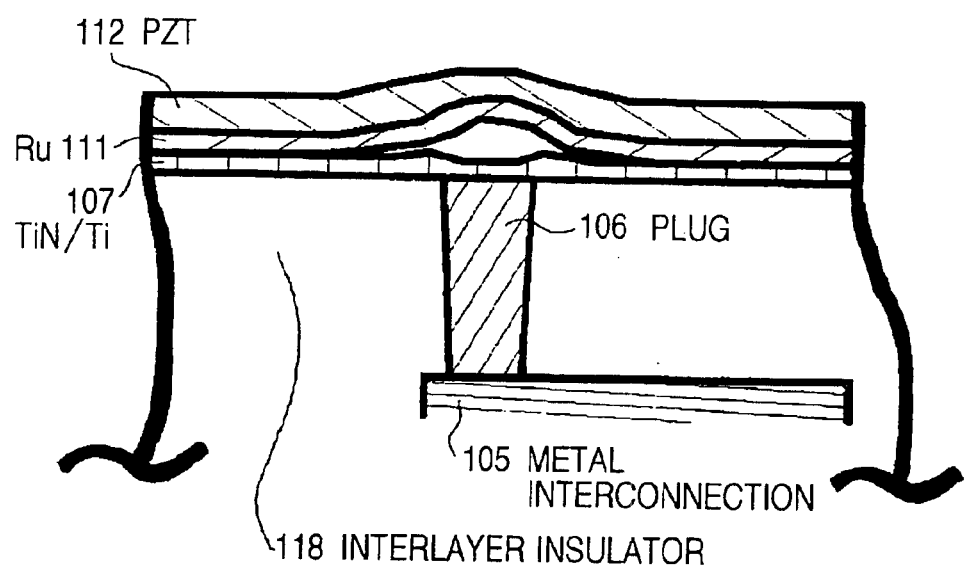
FIG. 8B is a diagrammatic view showing the feature of the photograph of FIG. 8A.

Now, a third practical embodiment of the semiconductor memory in accordance with the present invention will be described with reference to FIG. 6, which is a diagrammatic sectional view showing the third practical embodiment.

In this third practical embodiment, the multilayer structure constituted of the second metal film 10, the metal nitride film 9 and the first metal film 8 in the barrier layer under the lower electrode 11 is formed of Ta/TaN/Ta.

In the above mentioned embodiments, the second metal interconnection 16 filled in the contact hole formed in the capacitor cover film 15 is directly connected to the cap layer 14 formed on the upper electrode 13. In this third practical embodiment, the second metal interconnection 16 is connected to the cap layer 14 formed on the upper electrode 13 through a third plug 18 filled in a via hole formed in the capacitor cover film 15.

Incidentally, the barrier layer is in no way limited to the examples shown in connection with the above mentioned embodiments. The structure of the second metal film/the metal nitride film/the first metal film can be Ti/TaN/Ta, Ta/TaN/Ti, Pt/TiN/Ti, Pt/TaN/Ta, or Pt/TaN/Ti. In addition, the lower electrode can be formed of $RuO_2$/Ru, $IrO_2$/Ir, or $SrRuO_3$/Ru.

As seen from the above, the present invention is characterized in that the barrier layer is formed to include at least a first metal layer, a second metal layer, and a metal nitride layer between the first metal layer and the second metal layer. With this arrangement, it is possible to minimize the pealing and lifting of the lower electrode from the plug in the capacitor dielectric film forming process and the succeeding annealing process, with the result that it is possible to elevate the yield of production of the ferroelectric memory and the reliability of the device.

The invention has thus been shown and described with reference to the specific embodiments. However, it should be noted that the present invention is in no way limited to the details of the illustrated structures but changes and modifications may be made within the scope of the appended claims.

What is claimed is:

1. In a process for fabricating a semiconductor memory, a process of forming a capacitor on a semiconductor substrate, comprising the steps of:

forming a barrier layer comprising a triplelayer structure of a first metal film, a metal nitride film and a second metal film formed in the named order, said barrier film having a lower surface connected to an upper end of a conducting member having a lower end connected to an underlying layer;

forming a lower electrode on an upper surface of said barrier layer;

forming a dielectric film on an upper surface of said lower electrode; and forming an upper electrode on an upper surface of said dielectric film.

2. A process for fabricating a semiconductor memory, claimed in claim 1, wherein said conducting member is formed in an interlayer insulator film formed on said semiconductor substrate, said upper end of said conducting member reaching a surface of said interlayer insulator film, and said lower end of said conducting member reaching a underlying conducting layer or a surface of said semiconductor substrate, wherein said capacitor is formed by depositing said barrier layer, said lower electrode, said dielectric layer and said upper electrode on said surface of said interlayer insulator film in the named order to form a laminated film, and by patterning the laminated film so as to form said capacitor having said lower electrode electrically connected through said barrier layer to said conducting member, and wherein said step of forming said barrier layer includes the steps of:

forming said first metal film on said surface of said interlayer insulator film to form a lowermost layer of said barrier layer;

forming said metal nitride film on said first metal film; and forming said second metal film on said metal nitride film to form an uppermost layer of said barrier layer.

3. A process for fabricating a semiconductor memory, claimed in claim 1, wherein said metal nitride film is formed of a nitride of a metal element constituting said first metal film or said second metal film.

4. A process for fabricating a semiconductor memory, claimed in claim 1, wherein said first metal film, said metal nitride film and said second metal film are formed by one combination selected from the group consisting of:

Ti/TiN/Ti,

Ti/TaN/Ta,

Ta/TaN/Ti,

Pt/TiN/Ti,

Pt/TaN/Ta, and

Pt/TaN/Ti.

5. A process for fabricating a semiconductor memory, claimed in claim 1, wherein said lower electrode is formed of at least one selected from the group consisting of Ru, Ir, Ru oxide, Ir oxide and $SrRuO_3$.

6. A process for fabricating a semiconductor memory, claimed in claim 1, wherein said step of forming said barrier layer includes the steps of:

forming said first metal film on said surface of said interlayer insulator film;

forming said metal nitride film on said first metal film;

forming on said metal nitride film a predetermined number of multilayer film(s) each formed of a metal film and a metal nitride film; and forming said second metal film on said predetermined number of multilayer film(s) to form said uppermost layer of said barrier layer.

7. A process for fabricating a semiconductor memory, claimed in claim 1, wherein said conductive member is formed of mainly W.

8. A process for fabricating a semiconductor memory, claimed in claim 1, wherein said capacitor dielectric film is deposited at a film deposition temperature of not greater than 500 degrees Celsius.

9. A process for fabricating a semiconductor memory, claimed in claim 1, wherein said capacitor dielectric film is deposited at a film deposition temperature of not greater than 475 degrees Celsius.

10. A process for fabricating a semiconductor memory, claimed in claim 1, wherein said capacitor dielectric film is formed by depositing a PZT film by a chemical vapor deposition process at a substrate temperature of not greater than 430 degrees Celsius.

11. A process for fabricating a semiconductor memory, claimed in claim 1, wherein said capacitor dielectric film is formed by a sputtering or a solgel method.

* * * * *